United States Patent [19]

Gelbert et al.

[11] Patent Number: 4,666,294
[45] Date of Patent: May 19, 1987

[54] APPARATUS FOR EXPOSURE OF BOTH SIDES OF PRINTED CIRCUIT PLATES

[75] Inventors: Horst Gelbert, Eschborn; Walter Grimm, Mörfelden; Michael Kiessling, Langenselbold; Winifred Newiger, Cleeberg; Wolfgang Walch, Liederbach; Hans Werner, Eppstein, all of Fed. Rep. of Germany

[73] Assignee: Klimsch & Co KG, Frankfurt am Main, Fed. Rep. of Germany

[21] Appl. No.: 813,728

[22] Filed: Dec. 27, 1985

[30] Foreign Application Priority Data

Dec. 31, 1984 [DE] Fed. Rep. of Germany ....... 3447849
Aug. 26, 1985 [DE] Fed. Rep. of Germany ....... 3530414
Nov. 11, 1985 [DE] Fed. Rep. of Germany ....... 3539915

[51] Int. Cl.$^4$ ............................................. G03B 27/04
[52] U.S. Cl. ......................................... 355/89; 355/78
[58] Field of Search .................... 355/89, 78, 114, 127

[56] References Cited

U.S. PATENT DOCUMENTS 3,531,198 9/1970 Delp ...................................... 355/89
3,627,416 12/1971 Benson ................................... 355/89
3,734,616 5/1973 Mayhew et al. ....................... 355/89

FOREIGN PATENT DOCUMENTS 2240653 5/1985 Fed. Rep. of Germany .

Primary Examiner—Monroe H. Hayes
Attorney, Agent, or Firm—Kurt Kelman

[57] ABSTRACT

The equipment is intended for exposing both side of printed circuit plates by means of a contact print. The equipment comprises a master copy and printed circuit plates holder in a rack provided with feeding elements and guided in parallel between two light sources and comprising respectively one portion above and below the exposure plane. The holder is formed of a dual frame (1) the two frame portions 2,2' of which are formed to be moved part and together relative to one another and in parallel to one another and while remaining in a position parallel with respect to one another. Located in the frame portions (2,2') of the dual frame (1) is respectively one transparency (4) framed by a frame (5) provided at least on one side thereof with alignment elements (15), with suction ports (7) being provided in its counterdirected surfaces (6) along the circumferential edges thereof. The said frames (5) are formed to precisely conform in size with respect to one another to be suitably placed into the frame portions (2,2').

8 Claims, 11 Drawing Figures

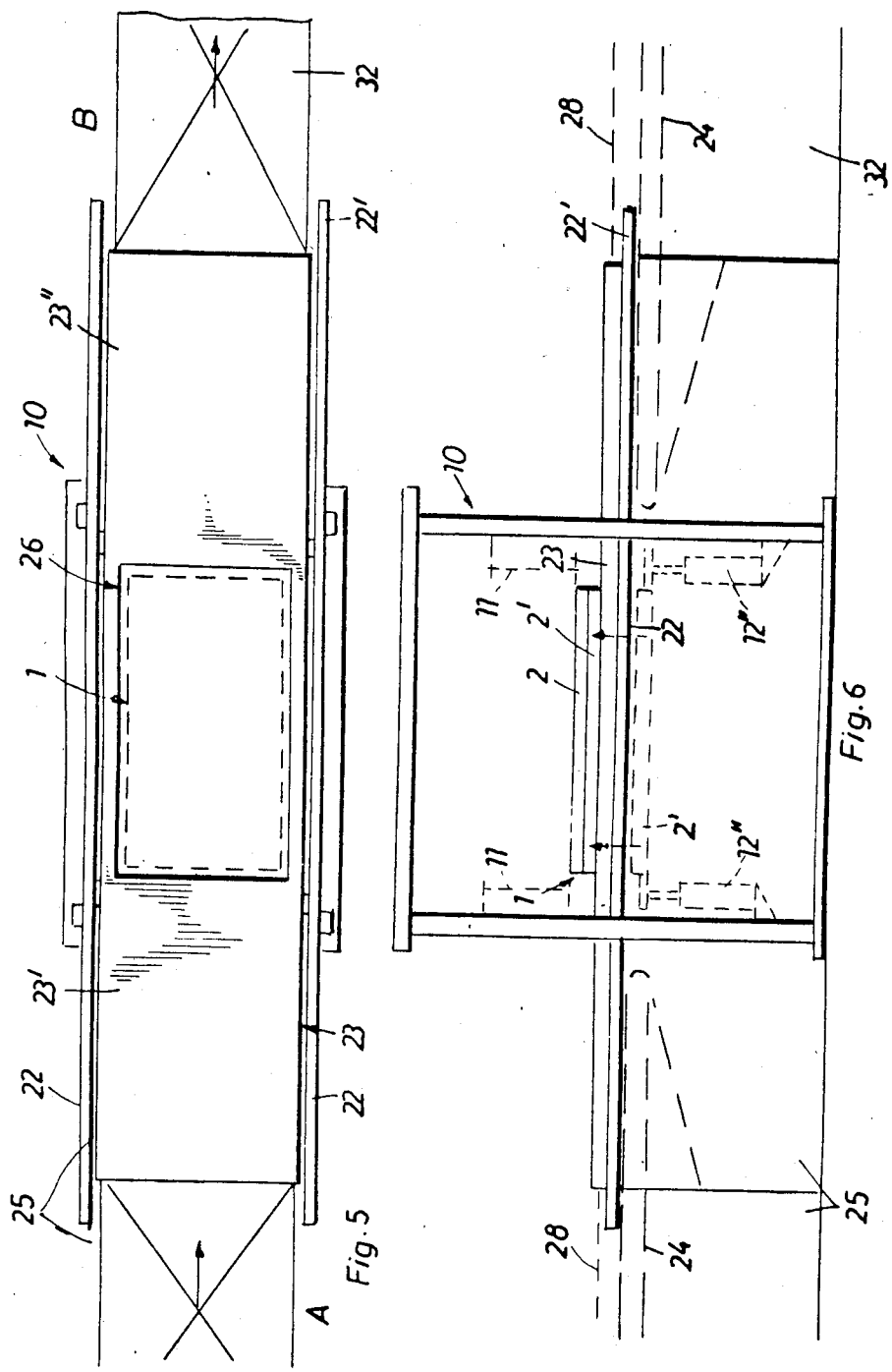

APPARATUS FOR EXPOSURE OF BOTH SIDES OF PRINTED CIRCUIT PLATES

BACKGROUND OF THE INVENTION

1. Field of the invention

The present invention is concerned with an apparatus for exposure of both sides of printed circuit boards by means of a contact print comprising a master copy and printed circuit plate holder guided in parallel between two light sources in a mounting rack provided with feeding members and disposed with respectively one portion above and one portion below the exposure plane.

2. Description of the Prior Art

To produce the current paths of an electronic circuit on printed circuit plates, it is well known in the art to provide the printed circuit plates with light sensitive coatings and to transfer the circuit diagram concerned by means of master copies applied and by exposure, to the said coating. As regards exposure, this is performed in different ways, viz. by combining the printed circuit boards respectively to be exposed with the two master copies and transparent masks to form a package allowing the said package to pass through a suitable exposure implement, or by first exposing the one side of the printed circuit plate along with the appertaining master copy on a suitable copying device and subsequently replacing the printed circuit plate with the master copy for the other side to the second exposure device next thereto. This will, of course, require the master copies to be located in precisely positioned association to the printed circuit board which is achieved by way of suitable fitting members. According to the former method, each printed circuit board to be exposed will have to be equipped with the master copies and transported in the form of a package through the exposing device; this envolves, of course, the disadvantage that, in this manner, one cannot simply continuously transport only the printed circuit boards of a whole series of identical circuit diagram through the exposing equipment but rather respectively only the package completely prepared for each printed circuit plate necessitating availability of a plurality of master copies of an identical circuit diagram if an at least approximately continuous way of operation is to be safeguarded. Such a continuous way of operation, admittedly, is safeguarded by the latter method. However, this is at the expense of relatively extensive mechanical efforts envolving two exposing systems and the required replacement mechanical means for the printed circuit boards.

SUMMARY OF THE INVENTION

Referring to a contact printing device of the aforementioned type, it is an object of the invention to so improve such a device as to permit automatic passage of a complete printed circuit plates series and rapid change-over of the device to other masters envolving short resetting times.

Another object of the invention resides in providing supply and discharge means for the apparatus to enable the printed circuit boards to be supplied and discharged. Moreover, an object of the invention provides for the formation of frame elements rapidly insertable into and removable from the apparatus. A still further object of the invention is the formation of special change-over frames permitting a particularly easy alignment of master copies formed as glass master plates in the said change-over frames.

Finally, it is an object of the invention to provide a special adjustment device for such change-over frames.

These and other objects of the invention that will become apparent from the description of the present invention, can be achieved with the aid an of apparatus which, in the practice of the invention, resides in that the holder is formed of a dual frame the two portions of which are capable of being moved apart and moved together relative to one another and in a position remaining parallel with respect to one another; that disposed in the portions of the dual frame is respectively one transparency framed by a frame at least on one side thereof provided with aligning elements, which in its counter-directed faces, along the circumferential edges thereof, is provided with suction ports, and that the said frames are formed, true to size, with respect to one another in a manner suitable for placement into the frame portions. In the apparatus of the invention, the master copy and printed circuit boards holder, hence, is configured as a dual frame expandable in parallel in the mounting rack of the apparatus in which frame is replaceably inserted the package consisting of transparency, master, master and another transparency in a manner ready for exposure to remain in the apparatus until a printed circuit plate series of the same circuit diagram has passed. The dual frame, for such a passage, is cyclically opened and closed. Maintaining the principles of simultaneous dual exposure of both sides, hence, provides the prerequisites permitting automation of the entire operation as relatively simple means of transportation enable the printed circuit plates of a series to be introduced into the dual frame and to be moved out after exposure which, depending on the efforts to be spent, can be performed either from one side only relative to the mounting rack of the apparatus, or from both sides.

The over-all apparatus, especially as regards the insertable transparent plate portion, is, of course, furnished with known per se elements for position-fixing and for vacuum exhaustion.

BRIEF DESCRIPTION OF THE DRAWINGS

The present invention, its function and the preferred and advantageous forms of embodiment thereof will now be described in closer detail with reference to the illustration of forms of embodiment, wherein FIG. 1 schematically shows a partial section through the dual frame with the parallel guide thereof;

FIG. 5 is a preferred form of embodiment of the apparatus;

FIG. 6 is a preferred form of embodiment of the apparatus;

DESCRIPTION OF PREFERRED EMBODIMENTS

Figure 1:
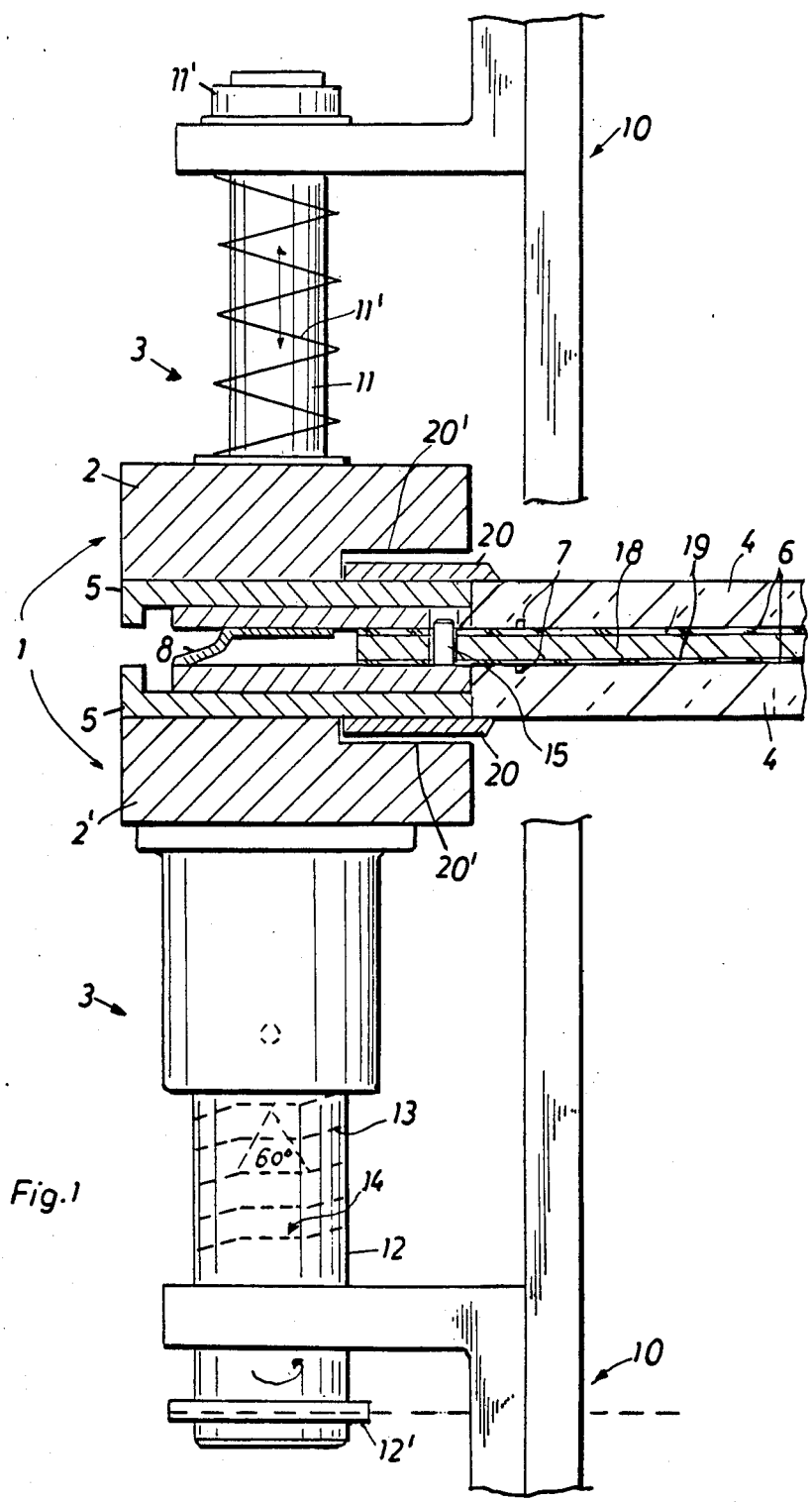
Figure 4:
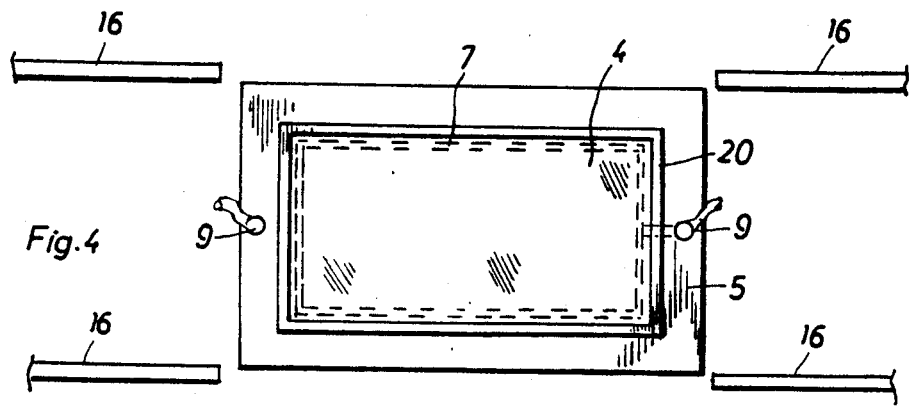
FIG. 4 is a plan view of the transparency frame with a transparency inserted.

As can be seen in FIG. 1, the holder is comprised of a two-part frame 1, the two frame portions 2, 2' having parallel guides 3. The circuit board 18, which is to be exposed on both sides, is placed with the two master copies arranged on both sides between two transparencies 4 which, on their part, are each suitably fixed in a frame 5. The upper frame 5 is shown in top view in FIG. 4. When the whole "package" consisting of the two frames 5, the two transparencies and the master copies 19 arranged therebetween, which is to be placed in the apparatus, is arranged in the frame portions 2, 2', the printed circuit boards 18 are moved apart between the two with a here only schematically illustrated printed circuit board conveyor 16 (FIG. 2, 4) and are first fitted on the frame portion 2'. For the exact insertion of the frames 5, the frame portions 2, 2' are provided with corresponding recesses 20' into which ledges 20 arranged on frame 5 fit. For fixing master copy 19 to the facing surfaces 6 of transparencies 4, they are provided with suction channels 7 along their circumferential edges, and these channels are in communication with suction connection 9'. As can be seen in FIG. 1, one or the other of frames 5 may be provided with a circumferential sealing profile 8 and the one and/or the other frame with a suction connection 9, enabling the entire layered "package" to be evacuated if this is necessary. When a whole printed circuit board series is exposed with the same circuit, it is only the two transparencies with the associated frame portions and the sucked-on master copies that will remain in the exposure device and only the printed circuit boards of a complete series to be exposed will be fed through the apparatus. Only upon a changeover to another series of another circuit diagram, a "package" prepared in the meanwhile, with two other master copies will be inserted into the apparatus as described.

Figure 2:
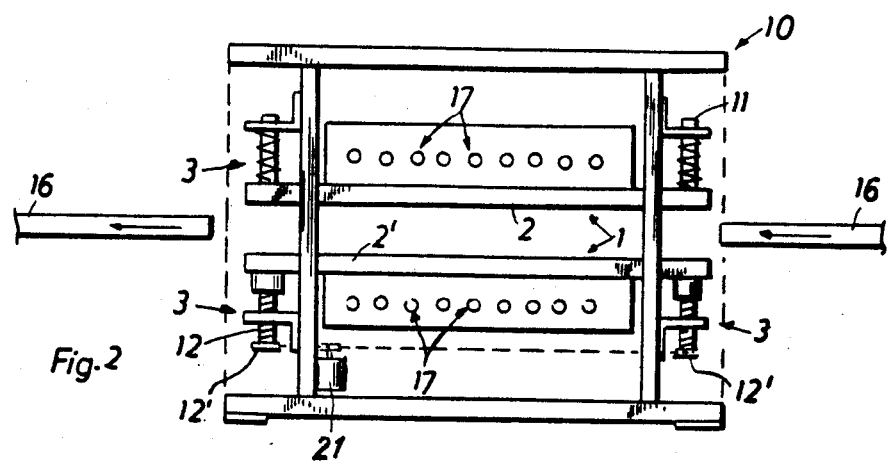
FIG. 2 is a side view of the over-all apparatus.
Figure 3:
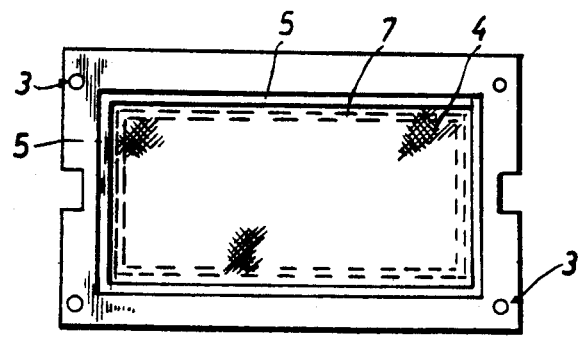
FIG. 3 is a plan view of the dual frame.

For the parallel adjustment of the two frame portions 2,2' in the rack 10, the parallel guides 3 for the two frame portions 2,2' of the dual frame 1, on the one hand, are formed as guide rods 11 in a manner axially displaceable on the rack 10, with the appertaining frame portion 2 being resiliently disposed relative to the rack 10, for which reason the guide rods 11 are furnished with compression springs 11' as shown by FIGS. 1,2. With the aid of four guide rods 11 of this type, the upper frame portion 2 suspends from rack 10 for which purpose the upper ends of the guide rods 11 are, of course, provided with suitable stops 11" that may be adjustable, whereas the bottom frame portion 2' is furnished with four set screws adjustable in synchronism and equally disposed in suitable manner on rack 10. Screws 12 at the ends thereof are provided with small chain pinions 12' and, via a chain drive, are driven in synchronism by a small driving motor 21. Also, it will be possible to employ pneumatic or hydraulic lift cylinders 12" as shown in FIG. 6 in place of the screws.

In the moved-apart position as shown in FIG. 2, the whole of the laminated package is inserted between the two frame portions 2,2' and mounted onto portion 2' whereafter motor 21 will be switched on to move the screws 12 in synchronism thereby moving the bottom frame portion 2' with the package mounted thereon upwardly against the other frame portion 2 which, thanks to the resilient arrangement, is well capable to escape to some degree until motor 21 is turned off by a suitable limit switch.

To account for the follow-up of such motors, the set screws 12 within their respective thread 13 are provided with 0° pitch sections 14 (FIG. 1) contained in the respective thread; as soon as the thread contact pin (not shown) at the bottom frame portion (2') is seized by the said 0° pitch section, the bottom frame portion 2' with the plate package mounted thereon is not lifted any further. For dimensioning the said 0° pitch sections 14, an arc length of, for example, 60° will be adequate as schematically shown in FIG. 1. As the printed circuit boards 18 are—as mentioned in the afore-going—perforated at predetermined points for electrically coupling the current paths of the one surface to those of the other surface, a high importance is to be attached to the true-to-size association of the two master copies 19 to the printed circuit plate 18. For that reason, the two transparent plates 4 and the frames 5 thereof, respectively, at least on one side thereof are provided with aligning elements 15 which—as shown in FIG. 1—are configured as register holes and register pins. By so configuring the aligning elements 15, corresponding perforations will be required both in the printed circuit board 18 and in the two master copies 19. However, also it will be possible to employ optically efficient aligning systems which especially applies if automatic printed circuit plate conveyors 16 are employed for introducing or receiving the printed circuit plates from a store pile. For, one cannot, for example, completely rely on that the marginal edges of the printed circuit boards 18 seized by the grippers of the printed circuit board conveyor 16, from one printed circuit plate to the other printed circuit plate exactly conform to the pattern of perforation for connecting the current paths of the one side to the other side. However, the utilization of an optical alignment system does not readily permit to obtain control pulses for the printed circuit board conveyors 16 and to control the same accordingly which, for that purpose, will, of course, have to be configured in controllable manner, for example, in the sense of a robot gripper arm, and mounted on the apparatus. Provided above frame 2 and below frame 2' are suitable light sources 17 effecting the respective exposure of the printed circuit plate 18 respectively contained in the apparatus. After exposure having been performed, frames 2,2' are moved apart, the exposed printed circuit board 18 is discharged by the printed circuit board conveyor 16 and the next printed circuit board 18 to be exposed is placed into position, whereupon the frames 2,2' are moved together again. The light sources 17 are not necessarily required to be flat light sources, as shown. It will rather also be possible to provide single light sources movable along the two exposure fields.

With reference to FIGS. 5 to 8, the printed circuit board conveyor 16 will now be described in closer detail, with the apparatus rack being illustrated in simplified form in FIGS. 5 and 6. In the subsequent description, reference is made to a form of embodiment wherein a slide 23 is provided with two suction plates 23',23" and with a dual frame passage aperture 26. Exposure means 17, rollers and suction connections for the slide have not been shown.

As revealed by FIGS. 5 and 6, guide rails 22 are provided on the rack 10 in parallel to the two frame portions 2,2' and below the upper frame portion 2, which guide rails 22, on both sides, protrude by a corresponding amount beyond the rack 10. Displaceably disposed in the guide rails 22 is the load and discharge slide 23 which is in the form of a downwardly directed suction plate. Disposed on the loading side, ahead of the dual frame 1 and between the guide rails 22, is an item transferring and aligning and aligning means 25 to which feeding means 24 can be loaded. In the preferred and illustrated form of embodiment, slide 23 is provided with two suction plates 23', 23" to confine at both sides the central dual frame passage aperture 26. Provided on the other end 22' of the apparatus is an item discharging means.

In the position as shown in FIG. 1, a printed circuit plate (not shown) transported by the item transferring and aligning means 25 is received by the suction plate 23' and displaced to the right into the area of the dual frame 1, the frame portions 2, 2' of which are spaced from one another by lowering the bottom frame portion such that the suction plate 23' can move between the two frame portions 2,2' to deposit the printed circuit plate on the bottom frame portion. To the extent that the suction plate 23" has already received an exposed printed circuit plate, the same is simultaneously deposited on the item discharging means 32 to become discharged. Thereafter, the slide moves again to the left back into the position as shown so that the dual frame passage aperture 26 is again above the dual frame 1 which, hence, can be moved together. At the same time, the slide, hence, is again in the loading position and the printed circuit plate taking the exposure position can be exposed from either side. After exposure, the dual frame 1 is opened again and slide 23 is moved further to the left by an amount sufficient for the suction plate 23" to be above the bottom frame portion 2' and for the exposed printed circuit board to be received by the suction plate 23", with the other suction plate 23" receiving a new printed circuit plate to be exposed. Thereafter, the same operation as described will be repeated.

Figure 7:
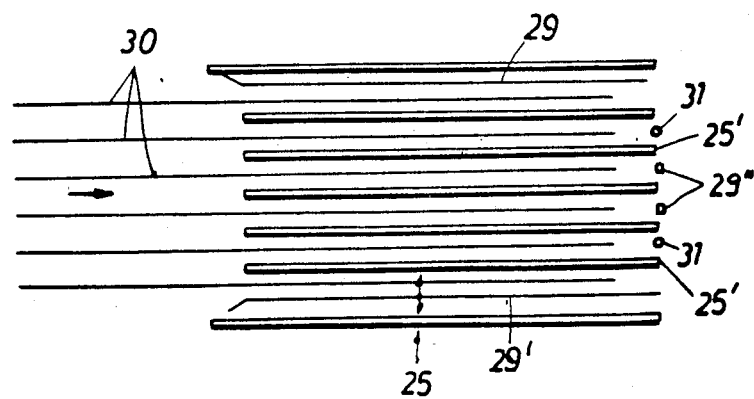
FIG. 7 is a plan view of the item transferring and aligning device of the apparatus according to FIG. 5.

The item transferring and aligning means 25 in the example as shown is formed as a lifter of grate-type configuration liftable over the slide displacement plane 28 (see FIG. 7). This will be imperative in order to enable the printed circuit plate to be exposed and supplied in a slightly deeper plane to be placed from the bottom and through a suction effect into an abutting relationship with the suction plate 23'. The feeding means 24 is provided in the form of endless strands 23 to engage at least in part between the rods of the grate-type lifter 25'. Discharge device 32 equally, is furnished with corresponding endless strands such that the exposed printed circuit plates deposited thereon can be discharged in the arrow direction.

Supplying the printed circuit plates to be exposed will, of course, have to be effected in a manner true to position to conform to the exposure master copies located in the dual frame 1 and the frame portions 2, 2' thereof, respectively. According to FIG. 7, the lifter 25' of a grate-type configuration on the one side thereof is, therefore, provided with a stationary item stop 29,29' and on the other side thereof with an adjustable item stop 29,29' causing the incoming printed circuit plate (not shown) to take the proper lateral position. Such item stops, relative to different printed circuit plate sizes, are of a correspondingly adjustable configuration. If a printed circuit plate with the left-hand side edge thereof is not yet in abutting relationship with the item stop, item stops 29' will be actuated to resiliently force the printed circuit plate against the second item stop 29. As regards the proper longitudinal alignment, the printed circuit plates, in the area of their front-sided inlet edges, are provided, for example, with small perforations whereas conical-ended reciprocating register pins 31 are located at the end of the item transferring and aligning means 25 which register pins in the event of a supplied printed circuit plate already aligned with the item stop 29, will adjust the printed circuit plate by lowering the same. A finger or ledge-type stop 29" adjustable in the supply path, in this respect will provide for a coarse adjustment when the item moves onto the supplying and aligning means 25 such that the register pins will only have to provide for a precision alignment, i.e. after supply of the printed circuit plate, the perforations thereof are either directly or almost directly mating with the register pins 31. Prir to displacement of the slide 23 to the right, the register pins 31 and stop 29" will be retracted such that the printed circuit board sucked, true to position, to the suction plate 23', can be moved to the exposure position and deposited on the bottom frame portion 2' which is provided with corresponding register pins 15, for example, to meet position inaccuracies, if any, which occur during continued transportation in that position.

Figure 8:
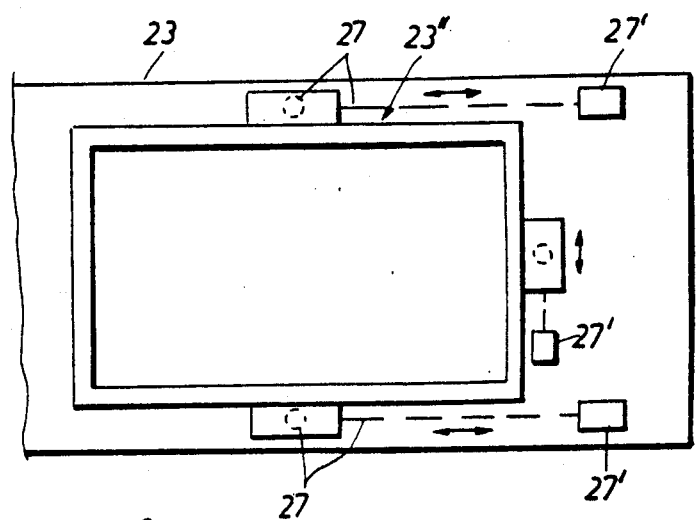
FIG. 8 is a plan view of a special form of embodiment.

According to FIG. 8, the slide, on the loading side thereof, can also be of a configuration such that the suction plate in slide 23 while remaining in that plane of arrangement, is adjustably controllable in that plane. In that form of embodiment, corresponding sensors are provided in the area of the exposure position, i.e. on dual frame 1, to scan corresponding apertures or the like markings on the printed circuit board, placing, via controllable alignment elements 27,27' (servo motors), the suction plate 23'" and the printed circuit board seated therein by means of a suitable electronic system into the precise exposure position thereby safeguarding also in this respect transfer of the printed circuit plate to be exposed, to the bottom frame portion of the dual frame, i.e. in a position conforming to that of the master copy.

Positioning paths of ±5 mm will be adequate for this purpose so that movable stops and register pins in the area of the item and alignment means 25 and also in the exposure device can be eliminated. If a slide having two suction plates is provided, only the load-sided suction plate need be of a controllable configuration of this type.

Figure 9:
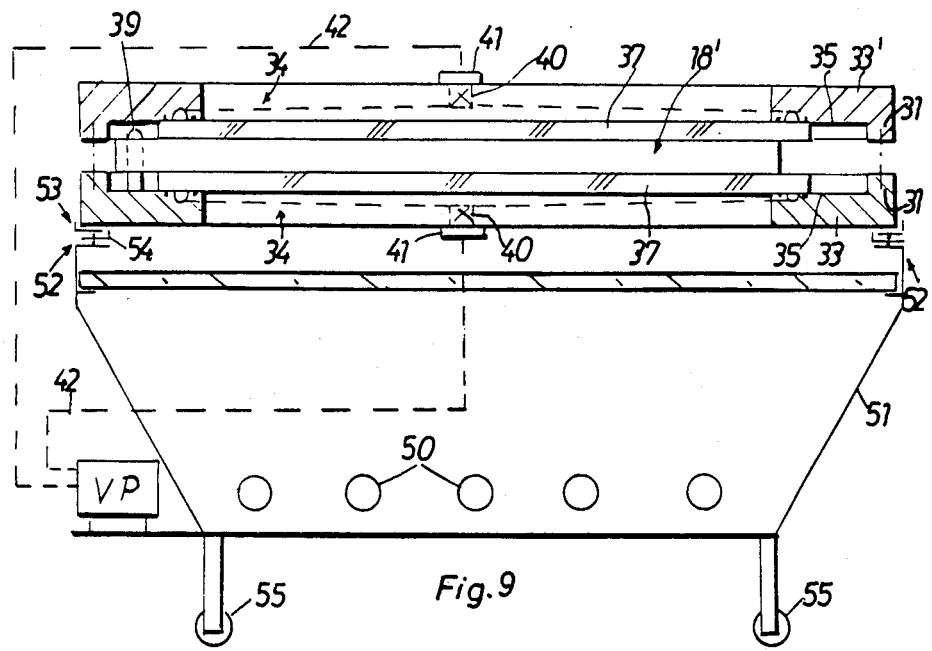
FIG. 9 is a sectional view of a preferred form of embodiment of a part of the apparatus placed upon a special adjustment means.
Figure 10:
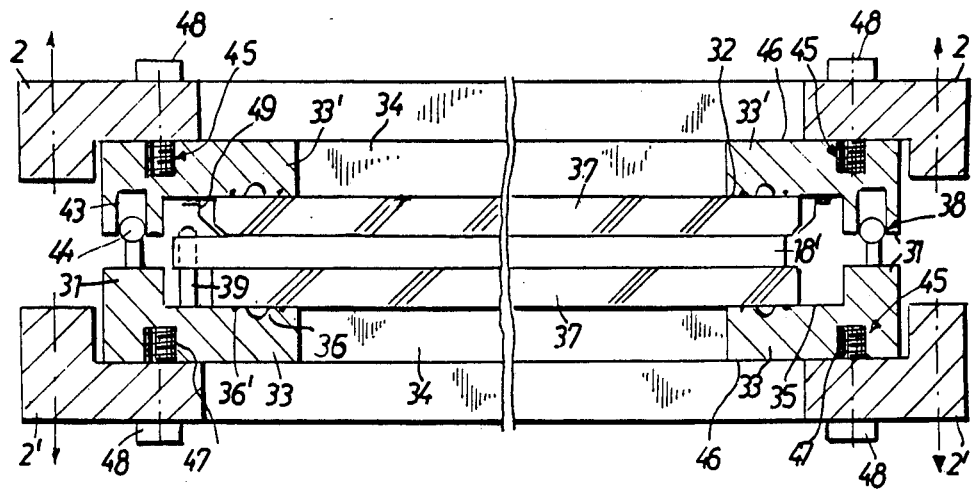
FIG. 10 is a sectional and enlarged view of the form of embodiment according to FIG. 9 located on the receiving frame of the exposure device.
Figure 11:
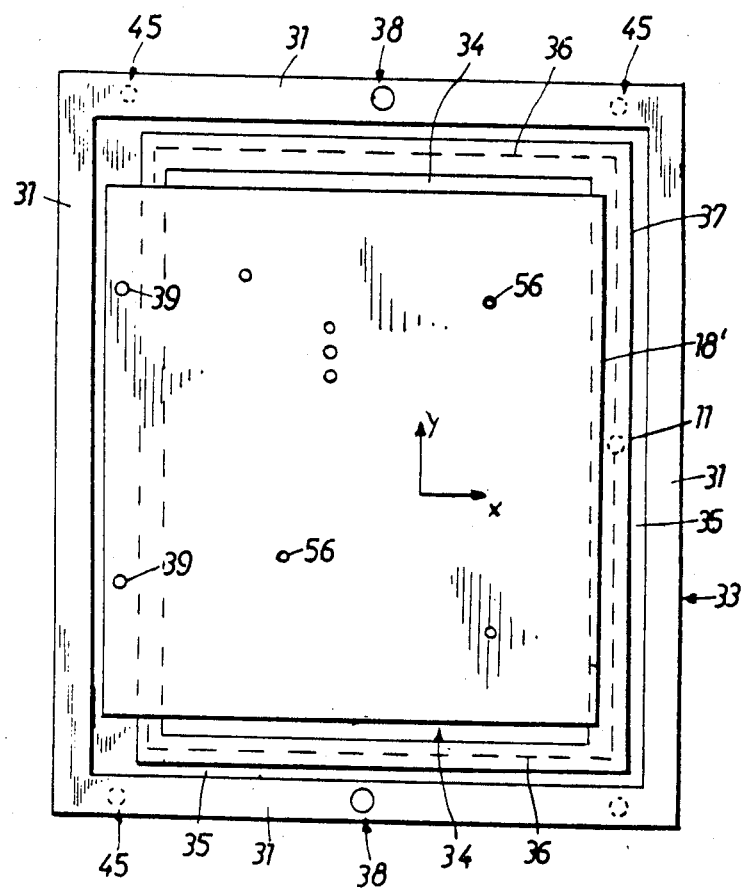
FIG. 11 is a top view of a frame part with a printed circuit board placed thereon.

Referring to FIGS. 9 to 11, a preferred form of embodiment of the frames will now be described wherein the transparent plates themselves serve as master copies (so-called "glass masters"). Such "glass masters" over master copies 19 of foil material, owing to their natural stability and lower heat sensitivity, exhibit the substantial advantage of an essentially increased exposure accuracy in the contact print to which major importance is attached especially in the printed circuit plate exposure.

Referring to FIGS. 9 to 11 employing the reference numerals as of 31, it should be noted that in the present instance, the term "light permeable masks" does not refer to flat structures but rather to masks in the form of two frames provided with counter-directed stems 31 adjustable with respect to one another backlash-free but detachable from one another; the said frames 33,33' confining correspondingly large light passageways 34, are provided with vacuum suction ports 36 along the marginal areas 35 thereof confining the light passageways 34. The two master copies 37 (glass masters) formed as optical flat sheets, within stems 31, are displaceably disposed in plane-parallel manner on the marginal areas of frames 33,33' with a pair of register pins 39 being located outside the master copy displacement area yet within the stems 31 on a side clear of guides 38 thereby enabling the respective optical flat sheet forming the master copy 37 for an exposure side to be displaced within the stems to a limited extent yet adequate to meet the present adjustment function.

Feasibly, the vacuum suction ports 36, in parallel to which, on either side thereof, are disposed seals 36' extending in closely spaced relationship, are furnished with a central vacuum connection 41 comprising a closure valve 40. In the absence of any other means for maintaining the vacuum relative to the optical flat sheets and the master copies 37, respectively, the vacuum conduits 42 can thereby be decoupled from the frames 33,33' and the vacuum connections 41, respectively, with the vacuum applied not breaking down.

Guides 38 causing the two frames 33,33' to move precisely together in a manner true to position, feasibly, are located on frame 33 on two sides clear of register pins in the form of ports 43 and, moreover, guides 38 in the form of spherical heads 44 fitting into ports 43 are disposed on the other frame 33 in alignment with the ports 43. For, these two frames 33,33' in accordance with the afore-going description, by means of fasteners 45, are equally secured to frames 2,2' of the exposure device expandable relative to one another, with the guides and bearings, respectively, of the said frames 2,2' being given a certain clearance in order to enable the two other frames 33,33', during their moving together, to precisely align with respect to one another thanks to guides 38. Fasteners 45 of each frame 33,33' are in the form of ports 47 provided with internal threads and terminating in the frame securing surface 46 facing away from the master copy. If the full package according to FIG. 9, oriented by a model printed circuit board, is in itself adjusted for a complete printed circuit plate series—which will be explained in closer detail in the following—the substantially planar package retracting the exposure device or the frames 33,33' thereof can be easily secured by fastening screws 48 seated on frames 2,2'.

Bores 47 on frames 33,33' and screws 48 on frames 2,2' are, of course, so provided as to be in alignment with one another. However, this will have no bearing on the precise adjustment of frames 33,33' with respect to one another when frames 2,2' move together quasi providing only a coarse adjustment of the frames 33,33', whereas frames 33,33' thanks to guides 38 are precisely adjusted with respect to one another for which purpose, as mentioned before, a certain clearance is provided in the guides and bearings, respectively, of frames 2,2'.

Actually, holding the glass master plate forming the master copies 37 by vacuum will be sufficient. In case the vacuum should no longer be adequate or cease to exist altogether, holding components 49 should at least be provided on the upper frame 33' to thereby safeguard that the glass master disposed there and forming the upper master copy 37 can drop from the frame 33' in the event of an inadequate vacuum. Such holding components 49 will, of course, have to be of a configuration such as not to protrude beyond the glass master plate which would affect the direct abutment of the printed circuit plate concerned; otherwise they will have to be located at such points of the frame 33' and the glass master plate, respectively, where the printed circuit plate 18 to be exposed will not get into abutment therewith.

The adjusting device for a package as presently described, according to FIG. 9 comprises a trough-type box 51 provided with light sources 30, with the said box 51 at the opening rim 52 thereof being provided with a support 53 conforming to the frame size. The support, preferably, is in the form of telescopic strips 54 extendible toward one side. Feasibly, the box 51 is furnished with wheels 55 or a mobile stand. Moreover, the box 51 can itself be provided with vacuum connections and vacuum conduits 42, respectively.

The described form of embodiment of the frames according to FIG. 10 in connection with the adjusting means according to FIG. 9 will have to be handled as follows:

First, the bottom frame 33 provided with a pair of register pins 39 is mounted on the support 53 of the box 51. The glass master sheet serving as a master copy 37 for the bottom side of the printed circuit plate 18 is then placed into the said frame. Thereafter, the model printed circuit plate with the register holes thereof is plugged on the pair of register pins 39 or mounted onto the glass master forming the master copy 37, respectively. As shown by FIG. 11, the master copy 37 protrudes beyond the model printed circuit plate 18' such that the master copy 37, oriented by the holes 56 for the current passages, is displaceable in the x-y direction such that the current path ends of the master copy precisely conform to the appertaining passage holes 56. This, visually, can be clearly and readily noticed when the light sources 50 of the adjusting means are in the switched-on condition. As soon as the bottom master copy 37 is adjusted to the holes 56, the vacuum is turned on, hence, fixing the master copy 37 to the bottom frame 33 followed by the same operation of alignment to the model printed circuit plate 18' with the upper master copy 37. Thereafter, the upper frame 33' is mounted and also the vacuum applied there. As shown, in that instance, adjustment of the two master copies 37 to the model printed circuit plate 18' is effected without using the pair of register pins 39 to which is adjusted only the model printed circuit plate 18'. The entire operation takes place, for example, during the time of passage of another printed circuit plate series through the exposure device. If the passage therethrough is terminated and if frames 33,33' with the glass masters thereof are removed, the entire box 51, preferably, of a mobile configuration with the new package mounted and adjusted in itself, laterally and transverse of the passage direction is moved toward the exposure device and by means of telescopic ledges 54 moved into the exposure device to be transferred to the frames 2,2' of the exposure device expanded by a corresponding amount, viz. with the fasteners 45 in alignment with the set screws 48 of frames 2,2'.

After securing of the frames 33,33' to the frames 2,2' the same will be moved apart and the model printed circuit plate 18' removed. Hence, the entire exposure device has been prepared for the passage of the next printed circuit plate series such that the printed circuit plates 18 of the said printed circuit plate series to be exposed, while cyclically supplied, can be exposed and, in a correspondingly cyclical sequence, discharged on the other side of the exposure device. The respectively supplied printed circuit board to be exposed which, as opposed to the model printed circuit plate 18', comprises a "resist" suitable for exposure, the model printed circuit plate 18' is provided with corresponding register holes for the pair of register pins 39 so that for each printed circuit plate 18 appertaining to a printed circuit plate series, the proper positioning relative to the two master copies 37 is safeguarded.

What is claimed is:

1. An apparatus for exposing both sides of a printed circuit board blank to light for manufacturing a photographically produced contact printed circuit board, which comprises
   (a) a rack holding an upper light source above an upper exposure plane and a lower light source below a lower exposure plane,
   (b) a holder for the printed circuit board blank, the holder comprising
      (1) two frame portions extending parallel to the exposure planes,
      (2) parallel guide rods axially displaceably mounting the two frame portions on the rack for movement towards and away from each other,
      (3) means for resiliently positioning one of the frame portions on the guide rods with respect to the rack,
      (4) synchronzied setting means for adjustably positioning the other frame portion on the guide rods with respect to the rack,
      (5) two like, vertically aligned rectangular frames positioned on the frame portions, each frame having a circumferential web projecting therefrom and a marginal area within the web, the webs and marginal areas of the frames facing each other and being in alignment, the marginal frame areas defining central light exposure passageways for the light from the light sources,
      (6) means for fastening each frame to a respective one of the frame portions,
      (7) guide means on two sides of the circumferential frame webs for detachably guiding the frames without play for alignment with each other,
      (8) transparent glass master copies extending over the light exposure passageways and displaceably arranged on the marginal frame areas for displacement in planes extending parallel to the exposure planes,
      (9) a pair of register pins on a side of the frames extending perpendicularly to the two sides for limiting the displacement of the glass master copies,
      (10) vacuum suction ports in the marginal areas for holding the glass master copies in position on the frames, and
   (c) a printed circuit board blank conveyor movable into and out of the rack for moving a respective one of the blanks into alignment with the light exposure passageways, the conveyor comprising
      (1) a guide track extending parallel to the exposure planes and below an upper one of the frames, the guide track protruding laterally from the rack to a loading station at one side of the rack and an unloading station at an opposite side of the rack,
      (2) a loading and unloading slide displaceably mounted on the guide track, the slide having a downwardly facing suction plate for holding the respective printed circuit board blank in a plane extending parallel to the exposure planes, and
      (3) means at the loading station for feeding the respective blank to the suction plate for displacement into alignment with the light exposure passageways.

2. The apparatus of claim 1, wherein the slide has two of said suction plates spaced from each other to define therebetween an opening at least co-extensive with the light exposure passageways and displaceable into respective alignment with the loading and unloading stations and with the light exposure passageways, and further comprising means at the unloading station for receiving and transporting the respective blank.

3. The apparatus of claim 2, further comprising actuating means for controllably displaceing at least one of the suction plates on the slide in said plane extending parallel to the exposure planes in directions extending parallel to the sides of the frames.

4. The apparatus of claim 1, further comprising a central vacuum connection connected to the vacuum suction ports and a closure valve in the central vacuum connection.

5. The apparatus of claim 1, wherein the guide means on the two sides of the circumferential frame webs comprises bores in the webs of one of the frames and spherical heads projecting from the webs of the other frame into sliding engagement with the bores.

6. The apparatus of claim 1, further comprising retaining means for the glass master copy at least on an upper one of the frames.

7. The apparatus of claim 1, further comprising a trough-shaped box holding one of the light sources, the box having a rim and a mount corresponding in size to the frame being disposed on the rim.

8. The apparatus of claim 7, wherein the mount is a telescopic ledge extendible towards one side.

* * * * *